United States Patent
Shiraiwa et al.

(10) Patent No.: US 9,252,039 B2
(45) Date of Patent: Feb. 2, 2016

(54) ELECTROSTATIC CHUCK APPARATUS

(71) Applicant: SHINKO ELECTRIC INDUSTRIES CO., LTD., Nagano (JP)

(72) Inventors: Norio Shiraiwa, Nagano (JP); Koki Tamagawa, Nagano (JP); Jiro Kawai, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 74 days.

(21) Appl. No.: 14/190,285

(22) Filed: Feb. 26, 2014

(65) Prior Publication Data

US 2014/0254061 A1   Sep. 11, 2014

(30) Foreign Application Priority Data

Mar. 11, 2013  (JP) .................................. 2013-048185

(51) Int. Cl.
*H01L 21/683* (2006.01)
*H01T 23/00* (2006.01)

(52) U.S. Cl.
CPC .................................. *H01L 21/6831* (2013.01)

(58) Field of Classification Search
CPC .................................................. H01L 21/6831
USPC ......................................................... 361/232
See application file for complete search history.

(56) References Cited

U.S. PATENT DOCUMENTS

| | | | |
|---|---|---|---|
| 8,982,530 B2* | 3/2015 | Lin | B32B 3/04 361/234 |
| 2004/0099377 A1* | 5/2004 | Newton et al. | 156/345.33 |
| 2004/0261946 A1* | 12/2004 | Endoh et al. | 156/345.15 |
| 2006/0066247 A1* | 3/2006 | Koshiishi | H01J 37/32018 315/111.21 |
| 2012/0281334 A1* | 11/2012 | Sasaki et al. | 361/234 |
| 2013/0286530 A1* | 10/2013 | Lin | B32B 3/04 361/234 |

FOREIGN PATENT DOCUMENTS

JP   2003-179129   6/2003

* cited by examiner

*Primary Examiner* — Thienvu Tran
*Assistant Examiner* — Lucy Thomas
(74) *Attorney, Agent, or Firm* — IPUSA, PLLC

(57) ABSTRACT

An electrostatic chuck apparatus includes a pedestal part including a side surface, an electrostatic chuck including a side surface and provided on the pedestal part, an adhesive part including a side surface and provided between the pedestal part and the electrostatic chuck, the adhesive part containing a resin adhesive agent that adheres the pedestal part and the electrostatic chuck together, a recess part provided in a portion of the side surface of the pedestal part and a portion of the side surface of the electrostatic chuck, the recess part being provided in an area that includes a side surface of the adhesive part, the recess part being provided along an outer periphery of the pedestal part, an outer periphery of the adhesive part, and an outer periphery of the electrostatic chuck, and a focus ring engaged with the recess part and covering the side surface of the adhesive part.

8 Claims, 3 Drawing Sheets

ELECTROSTATIC CHUCK APPARATUS

CROSS-REFERENCE TO RELATED APPLICATIONS

This application is based upon and claims the benefit of priority of the prior Japanese Patent Application No. 2013-048185 filed on Mar. 11, 2013, the entire contents of which are incorporated herein by reference.

FIELD

The embodiments discussed herein are related to an electrostatic chuck apparatus.

BACKGROUND

Conventionally, an electrostatic chuck apparatus is used to, for example, retain a wafer in a processing apparatus. As an example of the electrostatic chuck apparatus, there is an electrostatic chuck apparatus that adheres an electrostatic chuck to a pedestal by using a resin adhesive agent. The pedestal has high thermal conductivity, so that the temperature of a wafer to be retained by the electrostatic chuck can be prevented from increasing.

However, the resin adhesive agent is susceptible to corrosion by a process gas having high corrosiveness. Therefore, in a case where the electrostatic chuck apparatus is used in an environment using a process gas having high corrosiveness (e.g., inside a plasma etching apparatus using a process gas having high corrosiveness) for a long time, the resin adhesive agent may corrode.

In a case where corrosion of the adhesive agent occurs, the bonding strength between the pedestal and the electrostatic chuck may deteriorate, and a shape of a ceramic substrate included in the electrostatic chuck may change. Ina case where a cooling gas is supplied between the electrostatic chuck and the wafer, the change of the shape of the ceramic substrate may cause the gas to leak and prevent gas from being sufficiently supplied to a back surface of the wafer. This may lead to a case where the wafer cannot be sufficiently cooled or a case where the atmosphere inside the processing apparatus is degraded. Further, in a case where the adhesive surface between the electrostatic chuck and the pedestal is corroded, heat transfer between the electrostatic chuck and the pedestal cannot be sufficiently achieved at the adhesive surface. This lead to problems such as degradation of the distribution of the temperature of the wafer.

For example, Japanese Laid-Open Patent Publication No. 2003-179129 discloses an electrostatic chuck apparatus for preventing corrosion at an adhesive part. The electrostatic chuck apparatus has an electrostatic chuck that includes a side surface having a ring-shaped concave part and/or a convex part formed along an outer periphery of the electrostatic chuck, and an insulating ring that engages the concave part and/or the convex part.

However, corrosion of the adhesive agent cannot be sufficiently prevented even with the electrostatic chuck apparatus disclosed in Japanese Laid-Open Patent Publication No. 2003-179129. As illustrated in FIG. 1A, in a case where there is a space 15 between an insulating ring 14 and an electrostatic chuck 12 in an environment using a process gas having high corrosiveness (e.g., inside a plasma etching apparatus), the process gas may enter the space 15 and cause corrosion of a bonding layer 13.

For example, in a case of periodically cleaning the inside of a processing chamber, the cleaning may be performed in a state where a wafer 16 is not retained on the electrostatic chuck 12 (see FIG. 1B) or in a state where the wafer 16 is lifted. In this case, the process gas is even more likely to enter the space 15 and cause corrosion of the bonding layer 13, compared to the case illustrated in FIG. 1A.

Further, because the electrostatic chuck apparatus disclosed in Japanese Laid-Open Patent Publication No. 2003-179129 has the insulating ring 14 provided along the outer periphery of the electrostatic chuck, the size of the insulating ring 14 may increase depending on the size of the electrostatic chuck. This leads to an increase of the entire size of the electrostatic chuck apparatus as well as the weight of the electrostatic chuck apparatus.

SUMMARY

According to an aspect of the invention, there is provided an electrostatic chuck apparatus including a pedestal part including a side surface, an electrostatic chuck including a side surface and provided on the pedestal part, an adhesive part including a side surface and provided between the pedestal part and the electrostatic chuck, the adhesive part containing a resin adhesive agent that adheres the pedestal part and the electrostatic chuck together, a recess part provided in a portion of the side surface of the pedestal part and a portion of the side surface of the electrostatic chuck, the recess part being provided in an area that includes a side surface of the adhesive part, the recess part being provided along an outer periphery of the pedestal part, an outer periphery of the adhesive part, and an outer periphery of the electrostatic chuck, and a focus ring engaged with the recess part and covering the side surface of the adhesive part.

The object and advantages of the invention will be realized and attained by means of the elements and combinations particularly pointed out in the claims.

It is to be understood that both the foregoing general description and the followed detailed description are exemplary and explanatory and are not restrictive of the invention as claimed.

DESCRIPTION OF EMBODIMENTS

Next, embodiments of the present invention are described with reference to the accompanying drawings.

First, a configuration of an electrostatic chuck apparatus according to an embodiment of the present invention is described.

The electrostatic chuck apparatus according to the below-described embodiment includes a pedestal part, an electrostatic chuck mounted on the pedestal part, and an adhesive part provided between the pedestal part and the electrostatic chuck for adhering the pedestal part and the electrostatic chuck together. The electrostatic chuck apparatus also includes a recess part that is formed in a portion of a side surface of the pedestal part and a portion of a side surface of the electrostatic chuck. Further, the recess part is formed in an area that includes a side surface of the adhesive part. Further, the recess part is formed along an outer periphery of the pedestal part, an outer periphery of the adhesive part, and an outer periphery of the electrostatic chuck. The electrostatic chuck apparatus also includes a focus ring that is engaged with the recess part and covers the adhesive part.

Figure 1A:
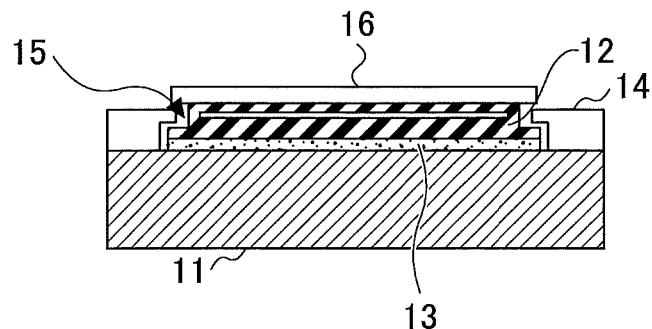
FIGS. 1A and 1B are cross-sectional views illustrating an electrostatic chuck apparatus according to a related art example.
Figure 1B:
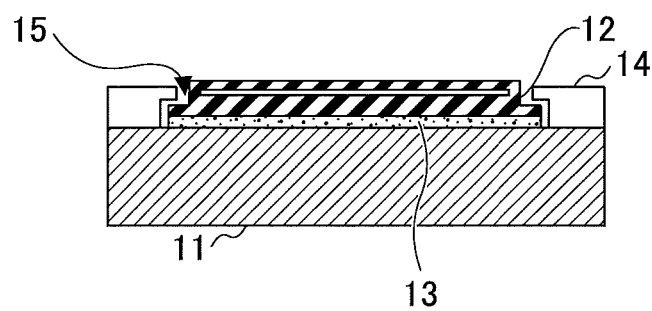
Figure 2:
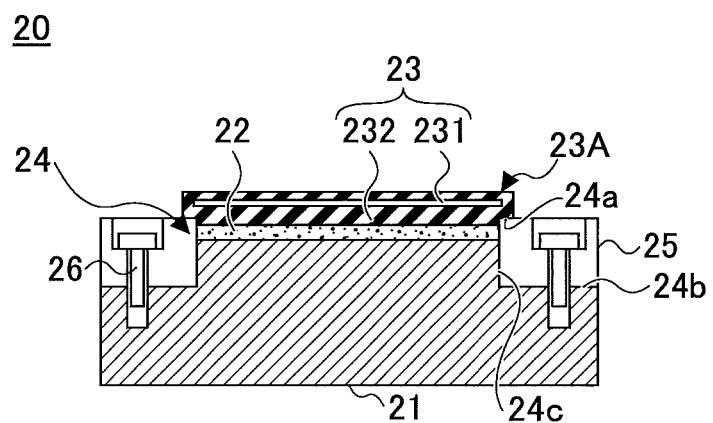
FIG. 2 is a cross-sectional view illustrating an electrostatic chuck apparatus according to an embodiment of the present invention.

FIG. 2 is a cross-sectional view of an electrostatic chuck apparatus 20 according to an embodiment of the present invention.

As illustrated in FIG. 2, the electrostatic chuck apparatus 20 includes a pedestal part 21, an electrostatic chuck 23 provided on the pedestal part 21, and an adhesive part 22 provided between the pedestal part 21 and the electrostatic chuck 23.

Further, a recess part 24 is formed in a portion of a side surface of the pedestal part 21 and a portion of a side surface of the electrostatic chuck 23. Further, the recess part 24 is formed in an area that includes a side surface of the adhesive part 22. Further, the recess part 24 is formed along an outer periphery of the pedestal part 21, an outer periphery of the adhesive part 22 and an outer periphery of the electrostatic chuck 23. The electrostatic chuck apparatus 20 also includes a focus ring 25 that is engaged with the recess part 24 and covers the adhesive part 22 (exposed side surface of the adhesive part 22). For example, the focus ring 25 may be fixed to the pedestal part 21 with a bolt 26 as illustrated in FIG. 2. The electrostatic chuck 23 includes an upper surface for adsorbing a wafer thereto and retaining the wafer thereon.

Next, parts/members of the electrostatic chuck apparatus 20 are described.

Although the material of the pedestal part 21 is not limited in particular, it is preferable to use a material having high thermal conductivity as the pedestal part 21. This is because the pedestal part 21 functions to transmit heat from a wafer by way of the electrostatic chuck 23 and cool the wafer. Various metal materials may be used for the pedestal part 21. For example, aluminum, stainless steel, or titanium may be preferably used for the pedestal part 21. The shape of the pedestal part 21 is not limited in particular. However, at least a surface of the pedestal part 21 facing the electrostatic chuck 23 is preferred to be a shape similar to the shape of the electrostatic chuck 23. That is, because the electrostatic chuck 23 usually has a circular disk-like shape to match the shape of the wafer to be mounted thereon, at least the surface of the pedestal part 21 facing the electrostatic chuck 23 is preferred to have a circular disk-like shape similar to the shape of the electrostatic chuck 23.

Further, the pedestal part 21 may also include various components/members such as a gas feed passage for cooling a wafer with gas, a wiring for supplying electricity to the electrostatic chuck 23, and a hole into which a lift pin is mounted.

A resin adhesive agent is provided on the adhesive part 22 for adhering the pedestal part 21 and the electrostatic chuck 23 together. Although the type of the resin adhesive agent is not limited in particular, it is preferable to use, for example, a silicone type adhesive agent, an epoxy type adhesive agent, or a phenol type adhesive agent.

In order to securely adhere the pedestal part 21 and the electrostatic chuck 23 together, the pedestal part 21 and the electrostatic chuck 23 are preferred to be adhered to each other by applying the resin adhesive agent throughout the entire surface of the pedestal part 21 and the entire surface of the electrostatic chuck 23 that face each other.

The structure of the electrostatic chuck 23 is not limited in particular. For example, as illustrated in FIG. 2, the electrostatic chuck 23 may include a ceramic substrate 232 having an electrode part 231 installed therein. Further, in a case where the electrostatic chuck 23 is used in, for example, a heating process, a heater may also be installed for performing the heating process. The electrostatic chuck 23 may also include a gas feed hole for cooling a wafer with gas or a hole into which a lift pin is placed.

The electrostatic chuck 23 may have, for example, a circular disk shape that matches the shape of a wafer to be retained thereon. The size of the electrostatic chuck 23 is not limited in particular. The size of the electrostatic chuck 23 may be selected to enable a desired wafer to be retained thereon. For example, as illustrated in FIG. 2, the electrostatic chuck 23 may have a size smaller than the size of the wafer to be retained. Alternatively, the electrostatic chuck 23 may have a size equal to or larger than the size of the wafer to be retained.

As described above, the recess part 24 is formed in a portion of a side surface of the pedestal part 21 and a portion of a side surface of the electrostatic chuck 23. Further, the recess part 24 is formed in an area that includes a side surface of the adhesive part 22. Further, the recess part 24 is formed along an outer periphery of the pedestal part 21, an outer periphery of the adhesive part 22, and an outer periphery of the electrostatic chuck 23. As illustrated in FIG. 2, the recess part 24 is preferred to be provided across the portion of the side surface of the pedestal part 21 and the portion of the side surface of the electrostatic chuck 23 in a height direction of FIG. 2. By providing the recess part 24 across the portion of the side surface of the pedestal part 21 and the portion of the side surface of the electrostatic chuck 23, the focus ring 25, which is to be engaged with the recess part 24, can cover a large area of the recess part 24 including the side surface of the adhesive part 22. Thereby, process gas can be positively prevented from entering the adhesive part 22.

Further, the recess part 24 is preferred to be formed in a portion of the electrostatic chuck 23 and a portion of the pedestal part 21 in a direction in which the pedestal part 21 and the electrostatic chuck 23 are layered (i.e. height direction of FIG. 2, hereinafter also referred to as "layer direction"). Particularly, an upper edge portion of the recess part 24 is preferred to be positioned lower than an upper surface of the electrostatic chuck 23 with respect to the layer direction of the electrostatic chuck 23 and the pedestal part 21. Further, a lower edge portion of the recess part 24 is preferred to be positioned higher than a lower surface of the pedestal part 21 with respect to the layer direction of the electrostatic chuck 23 and the pedestal part 21.

The method for forming the recess part 24 is not limited in particular. For example, the recess part 24 may be formed by forming the pedestal part 21 having a shape corresponding to the recess part 24, forming the electrostatic chuck 23 having a shape corresponding to the recess part 24, and laminating the pedestal part 21 and the electrostatic chuck 23 together by way of the adhesive part 22.

The shape of the recess part 24 is not limited in particular as long as the below-described focus ring 25 can be engaged therewith. For example, from the standpoint of facilitating a process of forming the recess part 24, a surface 24c of the recess part 24 that faces an inner peripheral surface 25c (see FIG. 3B) of the focus ring 25 is preferred to be flat as illustrated in FIG. 2. Particularly, the recess part 24 is preferred to have a substantially C-shaped cross section. It is, however, to be noted that the surface 24c of the recess part 24 facing the inner peripheral surface of the focus ring 25 may include a concave part and/or a convex part.

The focus ring 25 is provided to engage the recess part 24 and cover the adhesive part 22. Similar to the recess part 24, the focus ring 25 is formed along the outer periphery of the pedestal part 21, the outer periphery of the adhesive part 22, and the outer periphery of the electrostatic chuck 23. Further, the focus ring 25 is formed across the portion of the side surface of the pedestal part 21 and the portion of the side surface of the electrostatic chuck 23 in the height direction of FIG. 2. Thereby, the focus ring 25 prevents process gas or the like from entering the adhesive part 22.

Figure 3A:
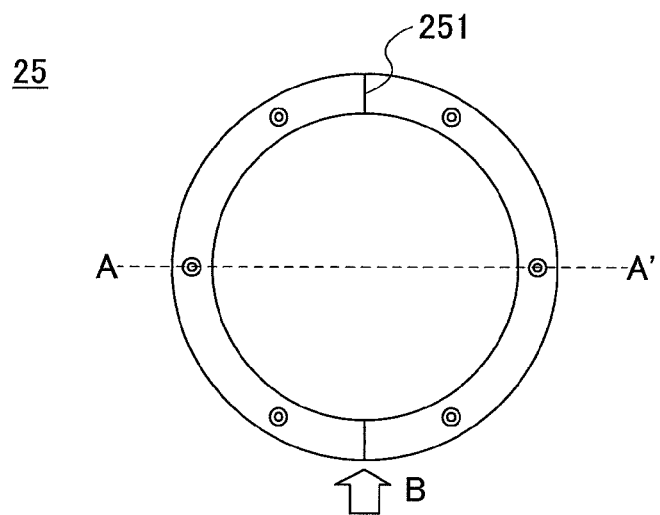
FIGS. 3A-3C are schematic diagrams for describing a focus ring of an electrostatic chuck apparatus according to an embodiment of the present invention.
Figure 3B:
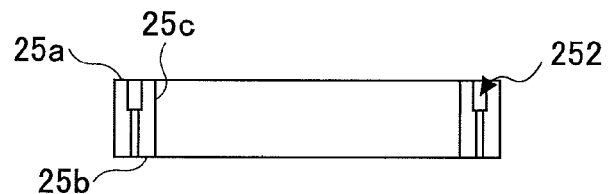
Figure 3C:
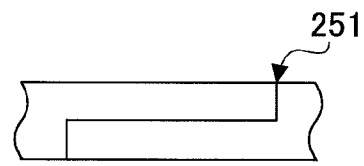

Next, a configuration of the focus ring 25 according to an embodiment of the present invention is described with reference to FIGS. 3A-3C. FIG. 3A is a plan view of the focus ring 25. FIG. 3B is a cross-sectional view taken along line A-A' of FIG. 3A. FIG. 3C is a schematic diagram illustrating an example of a configuration of the below-described division part (bonding part) 251 viewed from a direction indicated with a block arrow B of FIG. 3A.

The shape of the focus ring 25 is not limited in particular as long as the focus ring 25 is formed to engage the recess part 24 and cover the adhesive part 22. However, the focus ring 25 is preferred to have, for example, an annular shape (ring shape) as illustrated in FIG. 3A.

As described above, the recess part 24 is preferred to be formed with a C-shaped cross section. Therefore, the focus ring 25 is preferred to be formed with a shape corresponding to the shape of the recess part 24. That is, as illustrated in FIG. 3B, an inner peripheral surface 25c of the focus ring 25 is preferred to be a flat surface. In other words, the inner peripheral surface 25c of the focus ring 25 is preferred to be formed without any irregularities.

As illustrated in FIG. 2, the focus ring 25 is provided in the recess part 24 formed in the area including the side surface of the adhesive part 22 that adheres the pedestal part 21 and the electrostatic chuck 23 together. Thus, the focus ring 25 is preferred to have a configuration enabling attachment/detachment of the focus ring 25 without damaging the adhesive part 22. Therefore, the focus ring 25 is preferred to have a configuration enabling the focus ring 25 to be divided into multiple segments. For example, as illustrated in FIG. 3A, the focus ring 25 is preferred to be dividable at a division part 251. That is, the focus ring 25 is preferred to be dividable into multiple segments in a circumferential direction of the focus ring 25. Owing to this configuration, the focus ring 25 can be attached and detached without damaging the adhesive part 22 between the pedestal part 21 and the electrostatic chuck 23. Therefore, the focus ring 25 can be independently cleaned and replaced.

In a case where the focus ring 25 is configured to be dividable into multiple segments in its circumferential direction, the focus ring 25 includes a division part (bonding part) 251 at which the multiple segments are bonded to each other. The shape of the division part 251 is not limited in particular. For example, it is preferable to form a concave-shaped surface in one segment of the focus ring 25 and form a convex-shaped surface in another segment facing the one segment, so that the concave-shaped surface of the one segment and the convex-shaped surface of the other segment can be meshed to each other. A specific example of the division part 251 is illustrated in FIG. 3C. As illustrated in FIG. 3C, by forming a convex shape and a concave shape in corresponding surfaces of the one and the other segments that face and mesh with each other, the bond between the segments of the focus ring 25 can be increased. Therefore, it is preferable to form a convex shape and a concave shape in corresponding surfaces of the one and the other segments that face and mesh with each other. It is to be noted that the shapes formed in the facing surfaces of the segments of the focus ring 25 are not limited to the concave-convex shapes. Other shapes may be arbitrarily selected as the shapes of the facing surfaces of the segments of the focus ring 25.

It is preferable to form the recess part 24, so that there is no space between an inner peripheral surface 25c of the focus ring 25 and a surface 24c of the recess part 24 facing the inner peripheral surface 25c of the focus ring 25 in a case where the focus ring 25 is engaged with the recess part 24 (see FIGS. 2 and 3B). That is, an inner peripheral surface 25c of the focus ring 25 and the surface 24c of the recess part 24 facing the inner peripheral surface 25c of the focus ring 25 are preferred to have shapes corresponding to each other.

Further, with reference to FIGS. 2 and 3, it is preferable that there is no space between an upper surface 25a of the focus ring 25 and an upper surface 24a of the recess part 24, and no space between a lower surface 25b of the focus ring 25 and a lower surface 24b of the recess part 24. Thereby, process gas or the like can be positively prevented from entering the adhesive part 22. It is to be noted that the above-described expression "no space" is not intended to exclude a state in which fine spaces are formed resulting from the accuracy of a given process. That is, "no space" refers to a state in which facing surfaces have shapes corresponding to each other.

Although the material of the focus ring 25 is not limited in particular, the material of the focus ring 25 is preferred to have corrosion resistance against the process gas that is used. For example, silicon, quartz, ceramic or a fluorine-based resin may be preferably used as the material of the focus ring 25. In a case where ceramic is used as the material of the focus ring 25, a ceramic including, for example, $Al_2O_3$, $Y_2O_3$, MgO, or $ZrO_2$ as its main constituent may be preferably used. Further, the focus ring 25 may be coated with a film of the ceramic including, for example, $Al_2O_3$, $Y_2O_3$, MgO, or $ZrO_2$ as its main constituent by thermal spraying or the like. In a case where a fluorine-based resin is used as the material of the focus ring 25, PFA (perfluoroalkoxy) or PTFE (polytetrafluoroethylene) may be preferably used.

As illustrated in FIG. 2, the focus ring 25 may be fixed to the pedestal part 21 with a bolt 26. In the embodiment illustrated in FIGS. 2 and 3B, the bolt 26 is fixed to the pedestal part 21 by inserting the bolt 26 from a side of the upper surface 25a of the focus ring 25. However, the manner in which the bolt 26 is fixed to the pedestal part 21 is not limited to the embodiment illustrated in FIGS. 2 and 3B. For example, the bolt 26 may be fixed to the pedestal part 21 by inserting the bolt 26 from a side of a lower surface of the pedestal part 21 or from a side of a side surface of the focus ring 25. In a case where the bolt 26 is inserted from the side of the side surface of the focus ring 25, the bolt 26 is preferred to be positioned away from the adhesive part 22. That is, the bolt 26 is not to be positioned in the vicinity of the adhesive part 22.

Although the material of the bolt 26 is not limited in particular, an insulation material is preferably used as the material of the bolt 26. For example, ceramic or a resin material may be preferably used as the material of the bolt 26. In a case where a resin material is used for the bolt 26, a fluorine-based resin may be preferably used. It is more preferably to form the bolt 26 with the same material used for the focus ring 25.

With the above-described embodiment of the electrostatic chuck apparatus 20, the focus ring 25 is provided to engage the recess part 24 formed in the side surface of the pedestal part 21 and the side surface of the electrostatic chuck 23. Therefore, the focus ring 25 is formed with an outer diameter larger than an outer diameter of the electrostatic chuck 23 to the extent of a width of an area in which the bolt 26 can be provided. Therefore, corrosion of the adhesive part 22 can be prevented without increasing the size of the electrostatic chuck apparatus 20.

Figure 4:
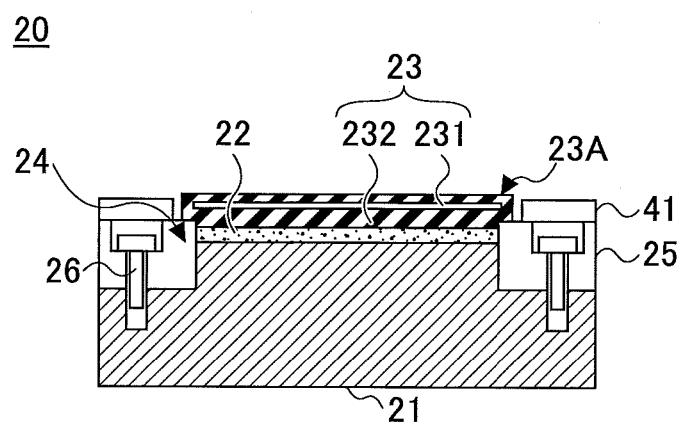
FIG. 4 is a cross-sectional view illustrating an electrostatic chuck apparatus provided with an upper focus ring according to an embodiment of the present invention.

In a case of inserting the bolt 26 from the side of the upper surface 25a of the focus ring 25 and fixing the bolt 26 to the pedestal part 21, the focus ring 25 may include a hole 252 for inserting the bolt 26 therein as illustrated in FIG. 3B. In this case, a substance generated during a given process may enter the hole 252 or a substance or the like may damage the bolt 26 during a given process. Therefore, as illustrated in FIG. 4, an upper focus ring 41 is provided on an upper part of the focus ring 25 for preventing a substance or the like from entering the hole 252 or damaging the bolt 26 during a given process.

The shape of the upper focus ring 41 is not limited in particular as long as the upper focus ring 41 is capable of blocking the hole 252. For example, the upper focus ring 41 may be formed having an inner periphery larger than an outer periphery of the electrostatic chuck 23 as illustrated in FIG. 4, so that the upper focus ring 41 can be easily attached or detached. In order to prevent the electrostatic chuck apparatus 20 from becoming large, the upper focus ring 41 is preferred to have an outer periphery equal to or smaller than the outer periphery of the focus ring 25.

The material of the upper focus ring 41 is not limited in particular. However, similar to the focus ring 25, the upper focus ring 41 is preferred to be formed with a material which is corrosion resistant to the process gas that is used. Thus, the material of the upper focus ring 41 is preferably the same material used to form the focus ring 25.

With the electrostatic chuck apparatus 20 according to the above-described embodiment of the present invention, process gas or the like can be positively prevented from entering the adhesive part 22 owing to the adhesive part 22 being covered by the focus ring 25. Therefore, corrosion of the adhesive part 22 can be prevented. Further, the above-described effects can be attained without increasing the size of the electrostatic chuck apparatus 20 owing to the configuration in which the focus ring 25 is mounted on the recess part 24 having a diameter smaller than an outer diameter of the electrostatic chuck 23.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electrostatic chuck apparatus comprising:
    a pedestal part including a side surface;
    an electrostatic chuck including an upper surface and a side surface and provided on the pedestal part;
    an adhesive part including a side surface and provided between the pedestal part and the electrostatic chuck, the adhesive part containing a resin adhesive agent that adheres the pedestal part and the electrostatic chuck together;
    a recess part provided in a portion of the side surface of the pedestal part and a portion of the side surface of the electrostatic chuck, the recess part being provided in an area that includes a side surface of the adhesive part, the recess part being provided along an outer periphery of the pedestal part, an outer periphery of the adhesive part, and an outer periphery of the electrostatic chuck, the recess part having an upper edge portion that is positioned lower than the upper surface of the electrostatic chuck; and
    a focus ring engaged with the recess part and covering the side surface of the adhesive part.

2. The electrostatic chuck apparatus as claimed in claim 1, wherein the focus ring is dividable into multiple segments.

3. The electrostatic chuck apparatus as claimed in claim 1, wherein the focus ring has an annular shape,
    wherein the focus ring is dividable into multiple segments in a circumferential direction of the focus ring.

4. The electrostatic chuck apparatus as claimed in claim 1, further comprising:
    an upper focus ring provided on an upper part of the focus ring.

5. The electrostatic chuck apparatus as claimed in claim 4, wherein the focus ring includes an inner peripheral surface,
    wherein the recess part includes a side surface facing the inner peripheral surface of the focus ring,
    wherein the side surface of the recess part and the inner peripheral surface of the focus ring have shapes corresponding to each other.

6. The electrostatic chuck apparatus as claimed in claim 5, wherein the focus ring includes an upper surface and a lower surface,
    wherein the recess part includes an upper surface and a lower surface,
    wherein the upper surface of the focus ring and the upper surface of the recess part have shapes corresponding to each other,
    wherein the lower surface of the focus ring and the lower surface of the recess part have shapes corresponding to each other.

7. The electrostatic chuck apparatus as claimed in claim 1, wherein the recess part includes
    a down-facing surface provided in the side surface of the electrostatic chuck,
    a side-facing surface provided in the side surface of the electrostatic chuck and the side surface of the pedestal part, and
    an up-facing surface provided in the pedestal part.

8. The electrostatic chuck apparatus as claimed in claim 3, wherein the multiple segments of the focus ring includes one segment having a concave-shaped surface and another segment having a convex-shaped surface and facing the concave-shaped surface, and
    wherein the concave-shaped surface of the one segment and the convex-shaped surface of the another segment are configured to mesh with each other.

* * * * *